United States Patent [19]

Hines et al.

[11] 4,176,900

[45] Dec. 4, 1979

[54] LOW INSERTION FORCE CONNECTOR

[75] Inventors: Clyde K. Hines, Arcadia; Everett J. Long, Claremont; Elmer W. Muench, Covina, all of Calif.

[73] Assignee: Everett/Charles, Inc., Pomona, Calif.

[21] Appl. No.: 863,786

[22] Filed: Dec. 23, 1977

[51] Int. Cl.[2] ........ H05K 1/07

[52] U.S. Cl. ........ 339/75 MP; 339/17 L; 339/176 MP

[58] Field of Search ........ 339/17 L, 75 M, 75 MP, 339/176 MP; 361/399, 413, 415

[56] References Cited

U.S. PATENT DOCUMENTS

| | | | |
|---|---|---|---|
| 2,957,155 | 10/1960 | Ehrlich | 339/176 MP |
| 3,516,046 | 6/1970 | Gettig | 339/176 |
| 3,518,610 | 6/1970 | Goodman et al. | 339/17 L |
| 3,601,770 | 8/1971 | Bowley | 339/17 L X |
| 3,665,370 | 5/1972 | Hartmann | 339/75 MF |
| 3,750,086 | 7/1973 | Iversen | 339/75 M |
| 3,899,234 | 8/1975 | Yeager et al. | 339/74 R |
| 3,905,670 | 9/1975 | Anhalt et al. | 339/75 MP |
| 3,920,302 | 11/1975 | Cutchaw | 339/75 MP |
| 3,982,807 | 9/1976 | Anhalt et al. | 339/75 MP |
| 3,997,231 | 12/1976 | Sherwood | 339/75 M |
| 4,021,091 | 5/1977 | Anhalt et al. | 339/75 MP |
| 4,076,362 | 2/1978 | Ichimura | 339/75 MP |

FOREIGN PATENT DOCUMENTS

| | | | |
|---|---|---|---|
| 1164725 | 5/1958 | France | 339/176 |
| 1169696 | 9/1958 | France | 339/176 |

OTHER PUBLICATIONS

ZIF Connector (lever activated), AMP Inc. Dwg. No. 3720-24D-143.

*Primary Examiner*—E. F. Desmond

*Attorney, Agent, or Firm*—Christie, Parker & Hale

[57] ABSTRACT

A low insertion force connector assembly comprising a number of contact modules. Each contact module includes a nonconductive contact carrier housing having oppositely facing sides and comprising, extending between the oppositely facing sides, a pair of cam openings and a notch. Included in each contact carrier housing is at least one electrical spring contact cantilevered in the contact carrier housing and extending adjacent one of the openings and along a side of the notch. The contact modules are aligned with the notches in a common row and the openings in first and second aligned rows. Also included in the connector assembly are first and second cam actuating means extending through, respectively, the first and second rows of openings. Each cam actuating means is adapted for actuating all of the cantilevered contacts adjacent the openings in the corresponding row into contact with a member inserted into the aligned notches.

43 Claims, 15 Drawing Figures

LOW INSERTION FORCE CONNECTOR

BACKGROUND OF THE INVENTION

This invention relates to a low, preferably zero insertion force connector assembly for a planar member such as a printed circuit board or the like. The invention also relates to a kit for such a connector assembly. The invention additionally relates to a contact carrier housing for the connector assembly.

Connectors for the edge of planar members such as printed circuit boards or the like are well known. Also, edge type connectors which require zero insertion force are also known.

Typically, zero insertion force edge connectors have one or more actuators which position the contacts apart for insertion of the member and a different position allowing the contacts to be brought into electrical contact with the member.

Generally these devices suffer from a number of disadvantages. For example, these devices are typically made of molded plastic parts. Each time the spacing for the contacts is changed, the mold for the molded plastic parts must be redone. This is not desirable because of the complexity and high cost of the molds.

Further, such zero insertion force edge connectors generally require relatively high actuation forces in order to actuate the contacts either into engagement or out of engagement with a member. The design of such prior art devices is also complicated by the tendency to spread the sides of the housing. This occurs due to the interaction between the actuating member and the spring contacts, which creates side forces on the connector housing, causing it to spread and as a result reduce contact pressure. Complicated arrangements have been devised to avoid the spreading of the housing. Also, metal cases have been placed on the outside of the contact carrier housing in order to hold the sides and prevent spreading.

SUMMARY OF THE INVENTION

Briefly, an embodiment of the present invention is a low insertion force connector assembly comprising a number of contact modules. Each contact module includes a nonconductive contact carrier housing having oppositely facing sides and comprising, extending through the housing and between the oppositely facing sides, at least one cam opening and a notch. Preferably there is a pair of cam openings. Included in each contact carrier housing is at least one electrical spring contact cantilevered in the contact carrier housing and extending adjacent one of the openings and along a side of the notch. The contact modules are aligned with the notches in a common row and the openings in first and second aligned rows. Also included in the connector assembly is an actuating means. Preferably there are first and second cam actuating means extending through, respectively, the first and second rows of openings and each cam actuating means is adapted for actuating all of the cantilevered contacts adjacent the openings in the corresponding row into contact with a member inserted into the aligned notches.

With such an arrangement, the connector assembly is made modular. Additionally the contact carrier housings and the spring contacts from one contact carrier housing to the next can be very closely spaced. For example, spacings in the order of 0.100 inches are achievable. Additionally the connector assembly is programmable in the sense that in each contact carrier housing a contact can be placed on one side or the other or on both sides, thereby allowing contact on a single side, double side, or any combination, among the various contact carrier housings.

Additionally the contacts may be replaceable from the top without any contact carrier housing disassembly merely by inserting or removing the contact from the contact carrier housing. Further, the cam actuating means may be easily inserted or removed without any contact carrier housing disassembly. Also, the contact carrier housings can be added incrementally from 1 to, for example, 128, or more, as required.

It is also possible to actuate the spring contacts into electrical engagement with a member and to disengage the contacts with very low forces. In one embodiment of the invention, one row consisting of 128 spring contacts required forces in the order of $4\frac{3}{4}$ inch pounds to actuate the contacts into engagement and 4 inch pounds to disengage the contacts.

Preferably the opening in each contact carrier housing forms a bearing for the cam actuating means and the force on each contact carrier housing through the bearing, due to the cam actuating means and contacts when the contacts are actuated, is completely contained in the same contact carrier housing. As a result there is no tendency to spread the sides of the housing.

Preferably the connector assembly includes at least one nonconductive spacer between adjacent contact carrier housings. Each spacer has oppositely facing sides and, extending between the oppositely facing sides, are a pair of cam openings and a notch. The openings in each pair of openings in the spacer are aligned with a different one of the rows of openings in the contact carrier housings, and the notch in each spacer is aligned with the row of notches in the contact carrier housing. With such an arrangement it is possible to select the spacing between contacts from one contact carrier housing to the next by selecting spacers with the appropriate dimension between the oppositely facing sides.

One embodiment of the invention is a contact carrier housing for up to two electrical spring contacts. Included is a nonconductive member comprising substantially oppositely facing first and second outer sides and substantially oppositely facing third and fourth outer sides between the first and second sides. A notch is provided in the member having an open end at the third side and a closed end between the third and fourth sides. A pair of spaced cam receiving openings is provided and the notch and the pair of openings extend through the member between the first and second sides. At least one recess, communicating with the notch, is provided in the first side of the member for receiving the spring contact. First and second spaced spring contact mounting passages extend through the member from the at least one recess to the exterior of the member at the fourth side, each for receipt of one of the spring contacts.

According to a preferred embodiment of the invention the contact modules, the cam actuating means, and preferably spacers, are provided in kit form for assembly by the user.

DETAILED DESCRIPTION

Figure 1:
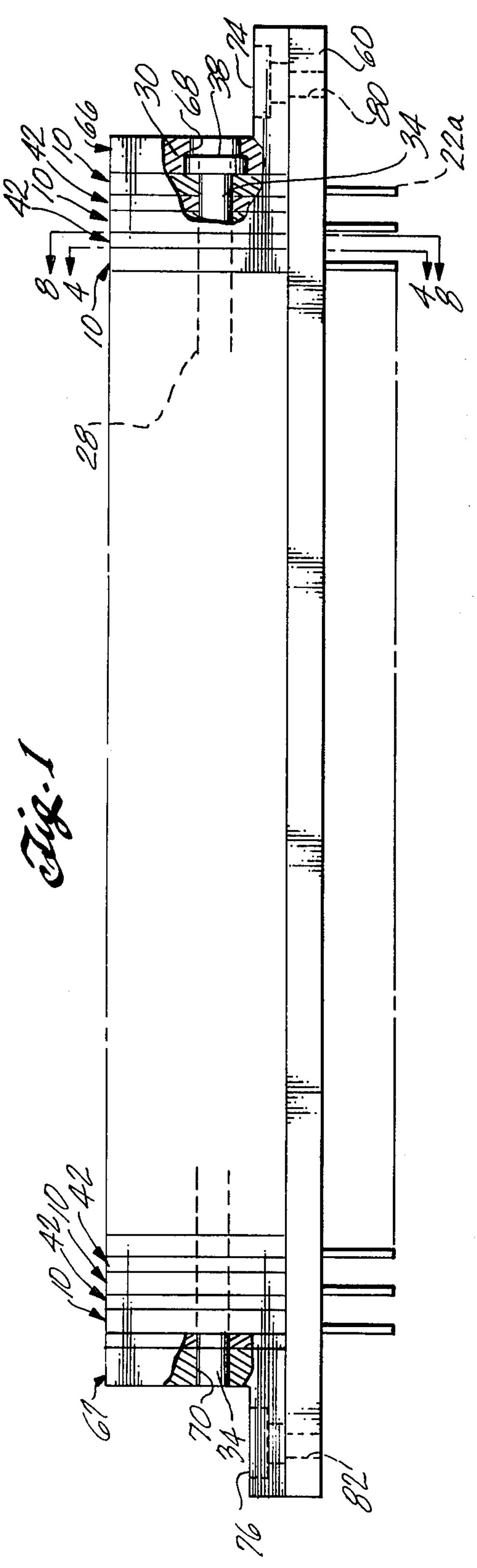
FIG. 1 is a side elevation view of the connector assembly and embodying the present invention.
Figure 2:
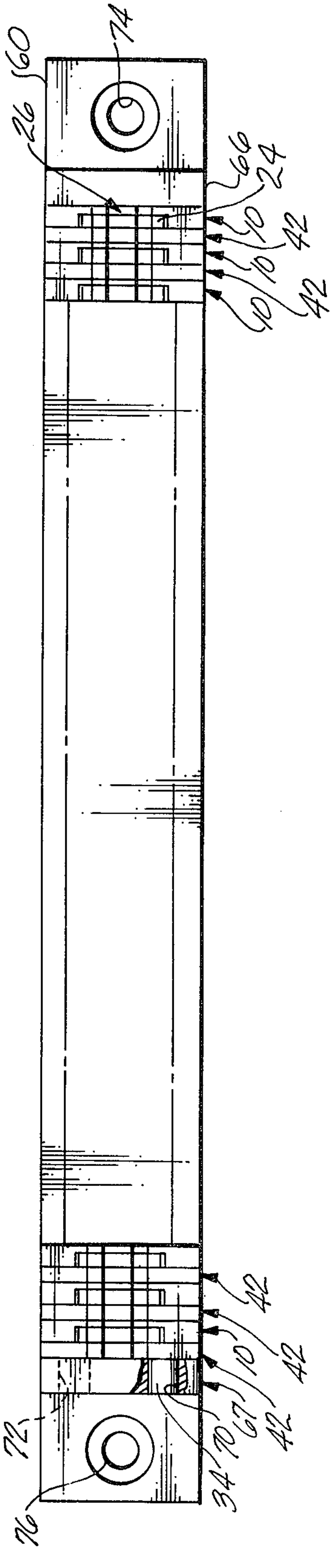
FIG. 2 is a top elevation view of the connector assembly of FIG. 1.
Figure 3:
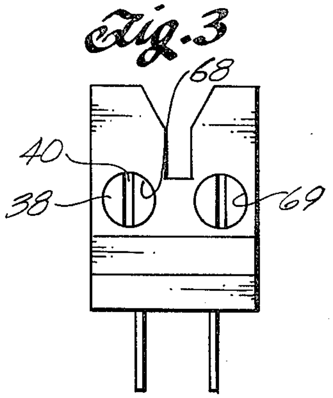
FIG. 3 is a right end elevation view of the connector assembly of FIG. 1.

Refer now to the low insertion force connector assembly depicted in FIGS. 1-9. The connector assembly includes a plurality of contact modules 10. Each contact module includes a non-conductive, preferably plastic, contact carrier housing 12. The contact carrier housing 12 has oppositely facing sides 14 and 16 and between the opposite facing sides 14 and 16 extend a pair of cam openings 17 and 18 which are preferably "D" shaped. Also extending between the sides 14 and 16 is a notch 20.

Each contact module also includes a pair of spaced leaf spring type electrical contacts 22 and 24. Preferably the contacts are made of a phosphor bronze with gold plate over nickel. Each spring contact is cantilever mounted in the contact carrier housing 12 and projects from the mounting thereof adjacent a different one of the cam openings 17, 18 and along a different side of the notch 20. Each of the modules is preferably identical and therefore is adapted so that when aligned, the notches 20 are aligned in a common or straight row as depicted at 26 in FIG. 2. Additionally, when the contact modules are so aligned, the openings 17 and 18 are aligned in first and second common straight rows. The row of openings 17 is depicted by dashed lines at 28 in FIG. 1, by way of example.

Also included in the connector assembly are first and second cam actuating means 30 and 32. Each cam actuating means extends through one of the rows of openings and is adapted for actuating all of the cantilevered contacts adjacent the openings in the corresponding row into contact with a member inserted into the aligned notches, such as the printed circuit board depicted at M in FIGS. 4 and 4A.

Preferably each of the cam actuating means includes a preferably "D" shaped cam shaft 34 and a thin strip of insulation material 36 which are elongated and extend along the length of the connector assembly through the openings in all of the contact carrier housings. The thin nonconductive strip of insulation material 36, preferably of a Mylar material, is positioned between the cam shaft 34 and the spring contacts which are adjacent to the corresponding one of the openings. The cam shaft 34 is preferably of a metallic material and the strip of insulation material 36 separates the cam shaft from the adjacent metallic spring contacts so that the contacts are not shorted together. The strip of insulation material additionally provides a bearing through which the cam shaft acts on the spring contacts during actuation. It can be seen from FIG. 4 that when the spring contacts are deactuated each opening 17, 18 has a portion of the opening on the both sides of the corresponding spring contact. This allows each cam shaft to be positioned so as to effectively move the adjacent spring contacts across the notch and toward the center of the contact module.

Each cam actuating means includes an actuating cap 38 positioned on the end of the shafts 34. The actuating cap forms a manually operable means for rotating the shaft to thereby actuate the adjacent spring contacts. The actuating cap 38 has an opening (not shown) which is "D" shaped and slips over the "D" shaped shaft. The cap is brazed or otherwise rigidly affixed to the cam shaft. Preferably the actuating cap 38 has a screwdriver slot 40 for manual actuation of the cam shafts.

Preferably the connector assembly includes a non-conductive spacer 42 between adjacent contact modules 10. Each spacer has oppositely facing sides 44 and 46. Extending between the oppositely facing sides 44, 46 are a pair of cam openings 48 and 50. Also extending between the oppositely facing sides is a notch 52. The notch 52 in each of the spacers is aligned with a row of notches in the contact carrier housings as depicted at 26 in FIG. 2 thereby providing a notch into which a member such as a printed circuit board may be inserted. Additionally, each of openings 48 and 50 in each of the spacers is aligned with one of the rows of openings in the contact modules 10 thereby allowing one of the cam shafts 34 and strip of insulation material 36 to pass therethrough as they pass through the adjacent contact modules.

Preferably each contact carrier housing 12 has a bottom side 54 opposite from the opening 20*a* for the notch 20. A connector pin is formed as an integral part of each spring contact. By way of example, connector pins 22*a* and 24*a* extend from the bottom side 54 of the contact carrier housing 12 and are exposed at the bottom side of the contact carrier housing for soldering, wire wrapping or otherwise connecting to electrical conductors.

Additionally the contact carrier housing 12 comprises a nonconductive preferably tubular shaped support surrounding a portion of each one of the pins. The nonconductive supports are depicted at 56 and 58 in FIG. 4, extending around the connector pins 22*a* and 24*a*. The supports 56 and 58 extend from the bottom side 54 of the contact carrier housing 12 for insertion into and mounting to a base support member.

The connector assembly includes base support member 60 which extends along the bottom side of all of the contact carrier housings and the spacers. The base member 60 includes a pair of openings extending completely through the base member 60 for each of the contact carrier housings 12. Two of such openings are depicted for one of the contact carrier housings at 62 and 64 in FIG. 4. The openings 62 and 64 are spaced so that when the contact carrier housings are properly aligned, a different one of the supports 56 and 58 extend through the corresponding openings 62, 64 in the base member.

Preferably an end cap is provided for supporting each end of the aligned contact carrier housings. An actuating end cap 66 is provided at the end of the connector assembly for the actuating caps 38 and a pilot end cap 67 is provided at the opposite end. The end caps are generally L-shaped having a lower leg for mounting against the base member 60 and a second leg which mounts at right angles to the base member parallel with the upstanding housings and spacers. The actuating end cap 66 has a pair of stepped holes 68 and 69 to receive and capture the two end caps 38 against the adjacent spacer 10 and prevent longitudinal movement of the cam shafts. The stepped holes also provide access to the slots 40 in the end caps 38. The pilot end cap 67 has a pair of circular openings extending through the upstanding leg which receive the extreme ends of two "D" shaped shafts 34 and the ends of the strips of insulating material 36. The two openings are depicted at 70 and 72 in FIGS. 1 and 2. The end caps 66 and 67 have pilot holes 74 and 76, respectively, for use in attaching the end caps to the base member. To this end, pilot holes 74 and 76 are used as a guide for drilling holes 80 and 82 in the base member, and screws (not shown) are used for rigidly connecting the end caps to the base member thereby retaining the contact carrier housings and spacers in place at right angles to the base support member. The end caps being attached to the base member also retain the cam shafts and thus hold the contact carrier housings and spacers together.

Significantly, the openings 17, 18 in each contact carrier housing 12 form bearings 17*a*, 18*a* for the corresponding cam shaft 34. Additionally the openings 17 and 18 are so located in the contact carrier housing that forces on each contact carrier housing, due to the cam shaft and the spring contacts (when the contacts are actuated), are completely contained in the same contact carrier housing without spreading the sides of the contact carrier housing. In this regard, the notch 20 has an open end 20*a* and an opposite closed end 20*b* and a pair of spaced sides extending between the open end and the closed end, and the pair of openings 17, 18 of each contact carrier housing are located between the closed end of the notch and the bottom side 54 of the contact carrier housing.

Figure 4:
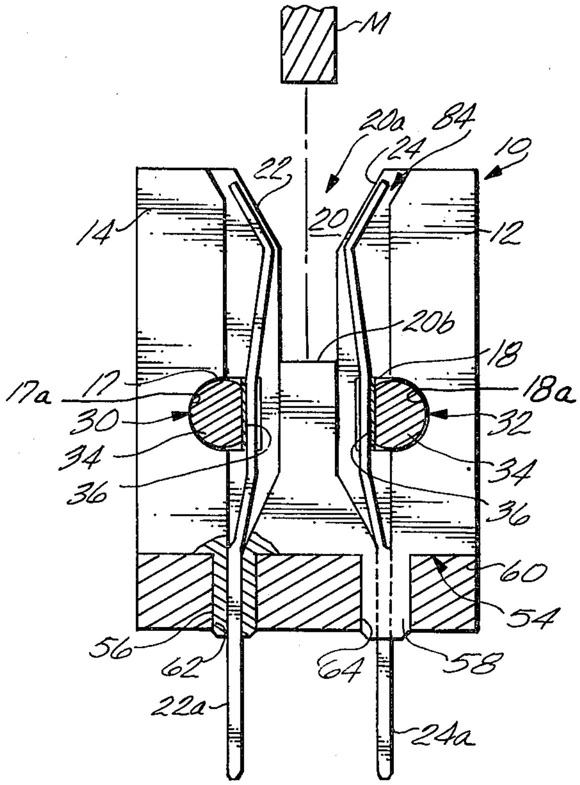
FIG. 4 is a section view of the connector assembly taken along lines 4—4 of FIG. 1 showing the contact carrier housing in elevation, showing the support in cross-section and showing the left side of the housing broken away to reveal the spring contact.
Figure 5:
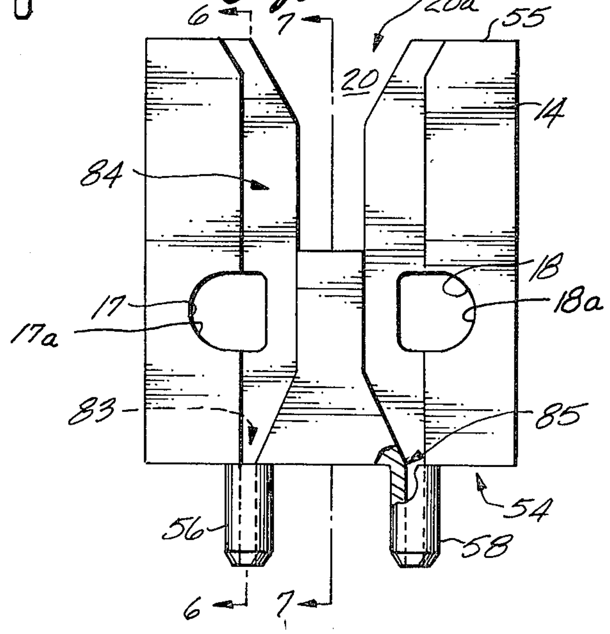
FIG. 5 is a front elevation of the contact carrier housing.
Figure 6:
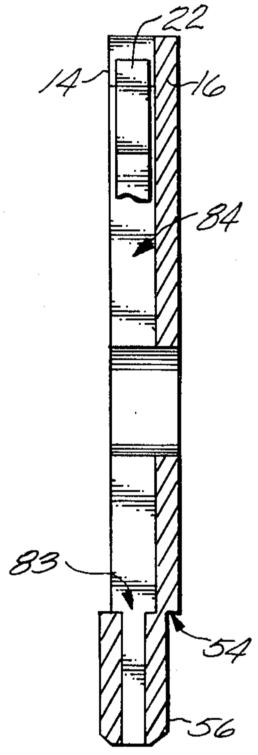
FIG. 6 is a cross-sectional view of the contact carrier housing taken along lines 6—6 of FIG. 5 showing a portion of one of the spring contacts.
Figure 7:
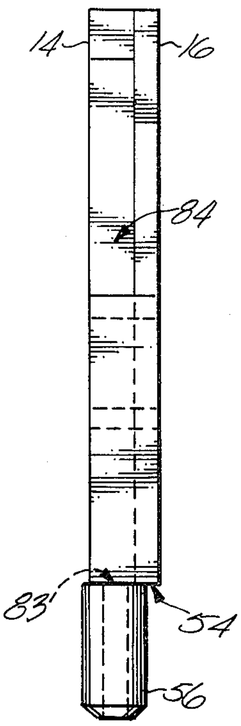
FIG. 7 is a cross-sectional view of the contact carrier housing taken along lines 7—7 of FIG. 5.

Referring to FIGS. 4, 5 and 6, each contact carrier housing has a recess 84 extending into the side 14 of the contact carrier housing and in communication with the notch. The upper free ends of each of the cantilevered contacts are located in the recess. As a result, the contacts do not bind between an adjacent spacer and contact carrier housing as the contacts are actuated.

Referring particularly to FIG. 5, a contact carrier housing is disclosed for mounting up to two electrical spring contacts and, as discussed above, is formed of a nonconductive member comprising substantially oppositely facing outer sides 14 and 16. Substantially oppositely facing lower and upper outer sides 54 and 55 extend between the first and second sides. The notch 20 in the member has its open end at the upper side 55 and a closed end positioned between the upper and lower sides 54 and 55. Included is a pair of spaced cam receiving openings 17 and 18 extending through the member between the sides 14 and 16, and at least one recess 84 is in communication with the notch for receiving the spring contacts. First and second spaced spring contact mounting passages 83 and 85 extend through the member from the recess to the bottom side for receipt of the spring contacts. Preferably, the member includes first and second tubular shaped mounting supports 56 and 58 on the lower side 54 of the member, in communication with the passages.

Figure 4A:
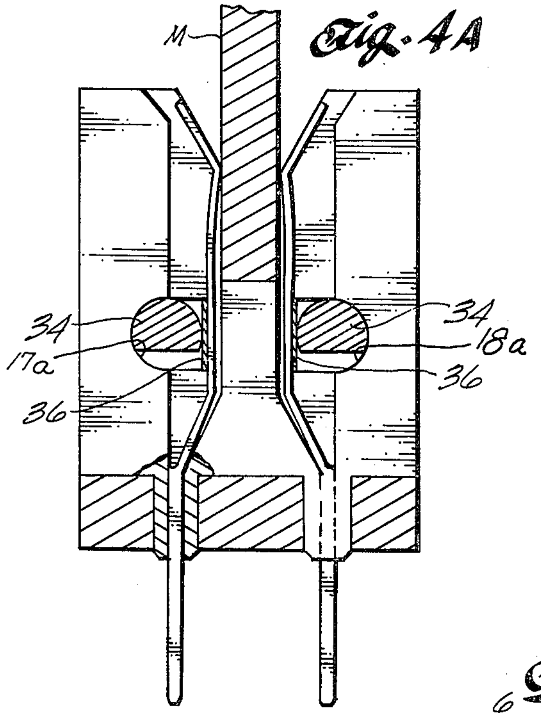
FIG. 4A is a similar view to that depicted in FIG. 4 with the cam shafts rotated 90° to actuate the cantilevered contact against a member "M" inserted in the row of notches.

Consider now the operation of the connector assembly. A member such as depicted at M in FIGS. 4 and 4A is inserted into the notch formed by the contact carrier housings and spacers, with the spring contacts 22, 24 relaxed and retracted under their own spring action to the positions depicted in FIG. 4. Thereafter member M is inserted with zero insertion force. Next, the actuating caps 38 and hence the cam shafts 34 are individually and manually rotated 90°, in either direction, using the slotted ends in the actuating caps. Rotation of the cam shafts causes the flat on each cam shaft to move away from the adjacent strip of insulating material 36. The larger diameter of the shafts forces the adjacent cantilevered spring contacts 22, 24 to close toward the center of the module against the sides of the member M and, in the process, provides a positive scrubbing electrical wiping action between the contacts and the member as generally depicted in FIG. 4A.

The cam shaft 34 on the left side (as seen in FIG. 4) is adapted for applying a force between at least one of the cam surfaces 17*a* in the row of cam openings (formed by openings 17) and the adjacent cantilevered contacts 22 to thereby actuate such cantilevered contacts into contact with the member M. Similarly the cam shaft 34 on the right side (as seen in FIG. 4) is adapted for applying a force between at least one of the cam surfaces 18*a* in the row of cam openings (formed by openings 18) and the adjacent cantilevered contacts 24 to thereby actuate such cantilevered contacts into contact with the member M.

It should be noted that the force due to each spring contact may be in the order of 100 to 125 grams for each contact which is appreciable when a large number of contact modules are involved. In one prototype module, 129 contact modules were used. Significantly, as generally discussed above, the sides of the contact carrier housing above the bottom 20*b* of the notch do not tend to spread since all contact pressure is completely contained within the lower portion of the contact carrier housing below the notch 20*b*.

Figure 10:
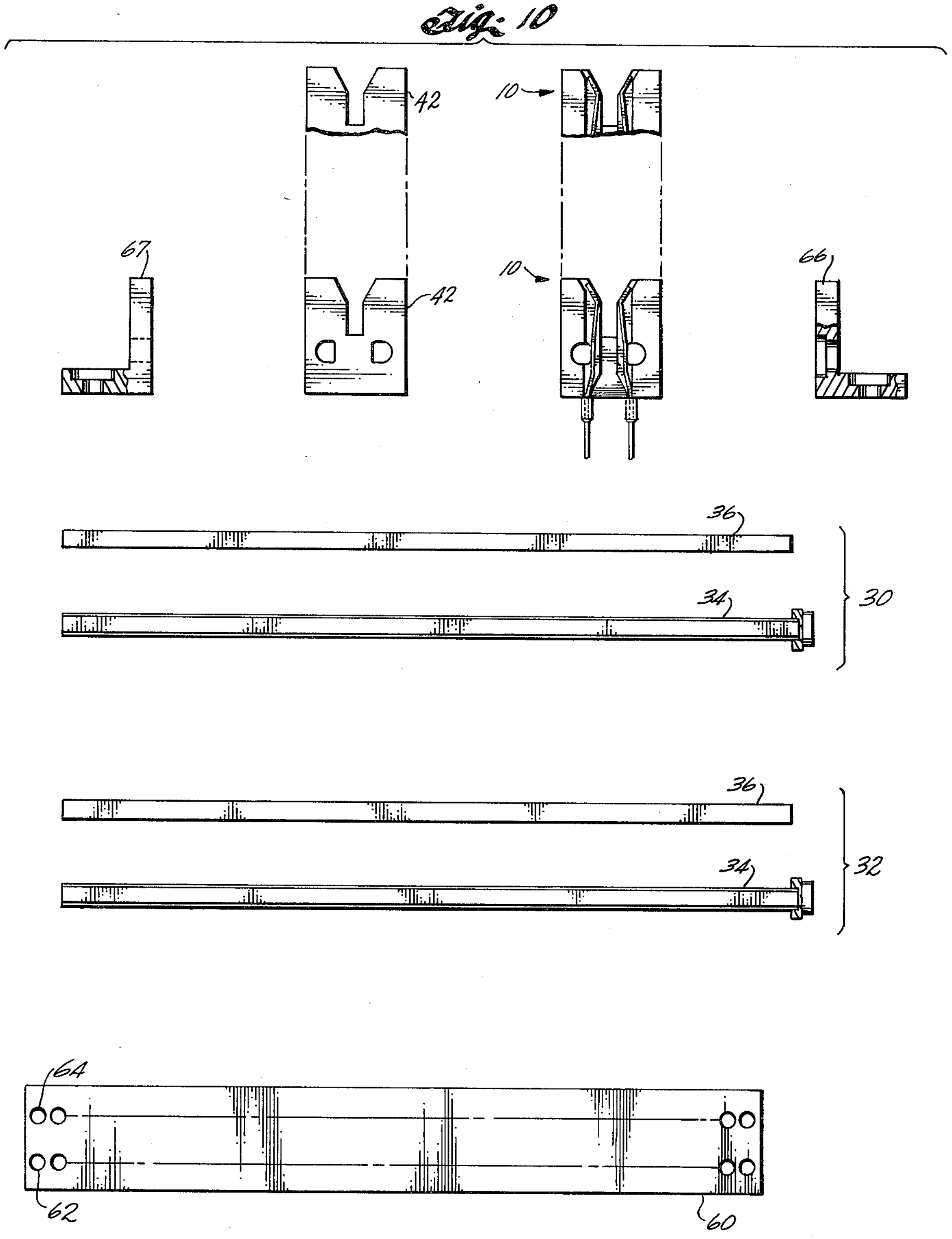
FIG. 10 is a schematic illustration of a kit for a connector assembly containing the various parts depicted in FIGS. 1-9.

Although one form of the invention is in a completed assembly, a preferred form of the invention is a kit which may be sold to and assembled by a user. FIG. 10 depicts a kit using the same reference numerals to identify the various parts as depicted in the completed assembly of FIGS. 1-9. More specifically, the kit includes a base member 60 with rows of holes spaced apart the proper distance for receiving the supports in the contact carrier housings. Additionally the holes are spaced apart longitudinally along the base member 60 so as to provide the proper spacing from one contact carrier housing to the next. A plurality of contact modules 10 are also provided in the kit together with a plurality of spacers 42. Only two such contact modules and two such contact spacers are depicted, the others being indicated by dashed lines. The kit also includes a pair of actuating means, including a cam shaft 34 and a strip of insulating material 36, an actuating end cap 66 and a pilot end cap 67. All of the parts are dimensioned and arranged as described above in connection with FIGS. 1–9.

To assemble the kit the user cuts the base member 60 to the desired length depending on the number of contact modules desired. Each of the contact modules is pressed into one of the sets of holes 62, 64 provided in the base member. The spacers are then inserted between the contact modules. The spacers of course are selected depending on the desired spacing dictated by the spacing between pairs of holes along the base member. The cam shaft 34 and the strip of insulating material 36 are inserted into the "D" shaped openings extending through the contact modules and spacers and the end caps are then positioned in place. The assembly is then completed by drilling a hole in the base member 60 in alignment with the pilot holes provided in the end caps and then screws, and corresponding nuts, if required, (not shown), attach the end caps to the base member.

In a preferred embodiment of the invention, spacing between rows of holes 62, 64 is at 0.100 inches, 0.125 inches, 0.150 or 0.156 inches and preferably the spacing between holes in each pair 62, 64 is 0.200 inches or 0.250 inches.

Figure 11:
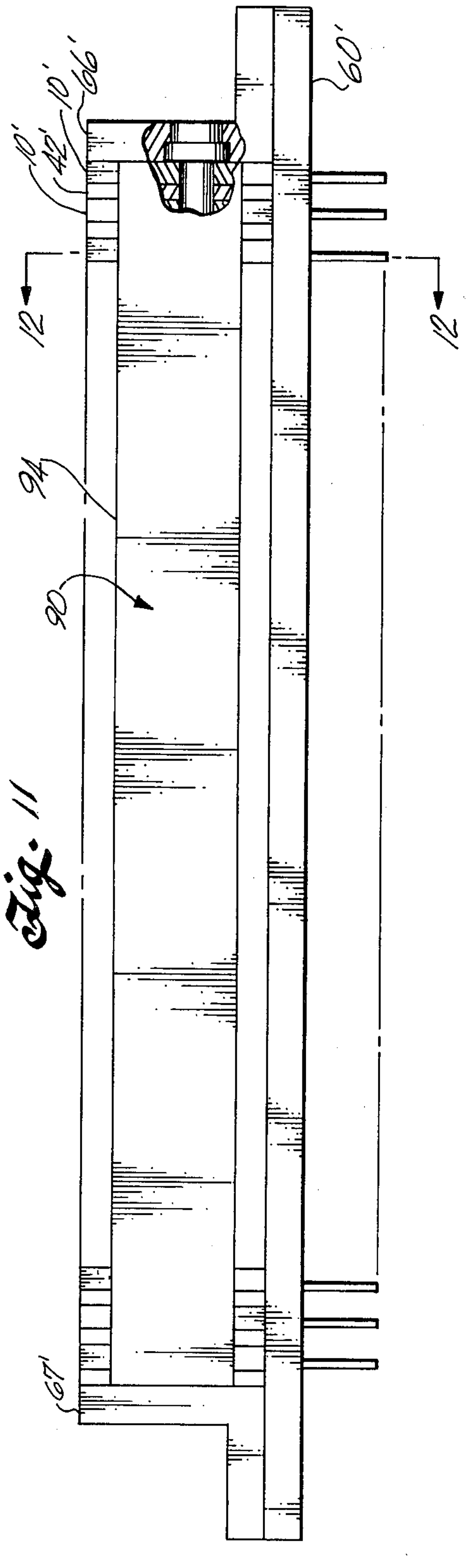
FIG. 11 is a side elevation view similar to that depicted in FIG. 1 of an alternate connector assembly and embodying the present invention.
Figure 12:
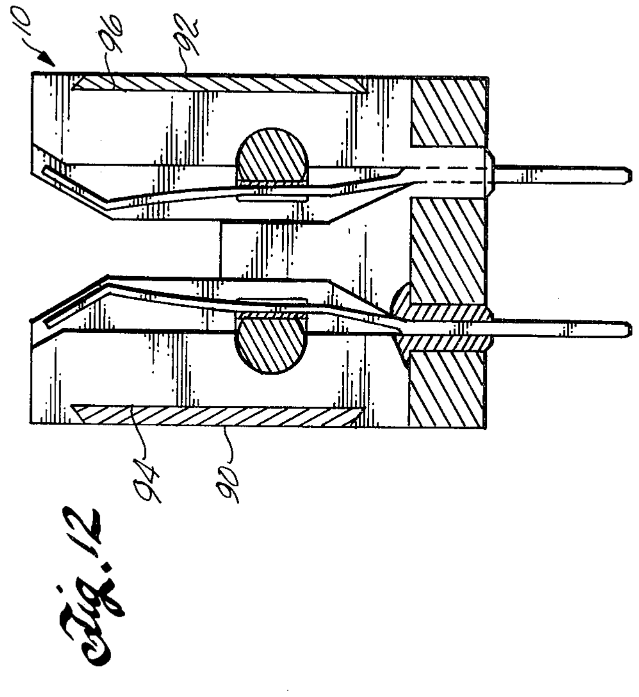
FIG. 12 is a section view of the connector assembly taken along lines 12—12 of FIG. 11 showing the contact carrier housing in elevation, showing the support in cross-section and showing the left side of the housing broken away to reveal the spring contact.

FIGS. 11 and 12 are views similar to FIGS. 1 and 4 of an alternate embodiment of the invention. Basically the alternate embodiment of the invention is identical to that depicted in FIGS. 1 and 4 except that stiffener members 90 and 92 are added on opposite sides of the aligned carrier housings and spacers. The stiffeners 90 and 92 maintain the contact carrier housings and spacers aligned in a straight row and prevent bowing along the longitudinal axis of the connector assembly.

FIGS. 11 and 12 use the same reference numerals to identify the same elements as those used in FIGS. 1 and 4 except that a prime has been added to indicate the alternate embodiment. Referring specifically to the stiffeners, it will be noted that channels 94 and 96 are provided extending along opposite sides of the connector assembly through all of the carrier housings 10' and the spacers 42'. The stiffeners are positioned in the respective channels and the channels are stiffeners form dovetail interlocking joints therebetween which not only retain the stiffeners in place but maintain the housings and spacers in the straight aligned condition. The end caps 66' and 67' do not contain the channel and therefore extend over the ends of the stifferners 90 and 92 and prevent them from sliding out.

Figure 8:
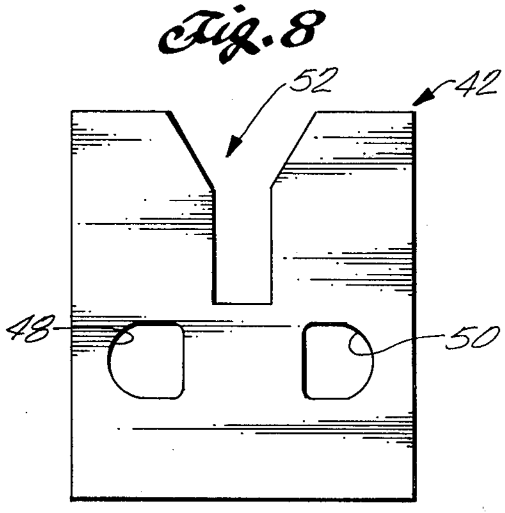
FIG. 8 is a front side elevation view of one of the spacers of FIG. 1 taken along lines 8—8 of FIG. 1.
Figure 9:
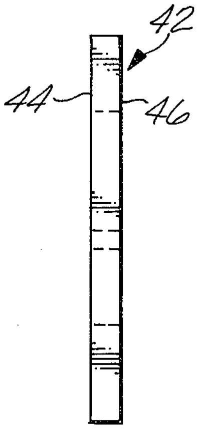
FIG. 9 is a right side elevation view of the spacer of FIG. 8.
Figure 13:
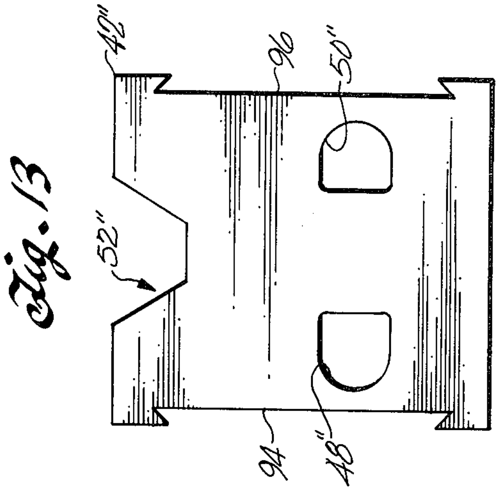
FIG. 13 is a front elevation view, similar to the view depicted in FIG. 8, showing a combined spacer and key for use in place of one or more of the spacers in the embodiment depicted in FIG. 11.

FIG. 13 is a view similar to FIG. 8 of an alternate spacer 42''. Again, the same reference numerals are used to identify the same elements as those in FIG. 8 except that double primes are added to indicate the modified structure. The spacer 42'' of FIG. 13 forms a combined spacer and key for the connector assembly. Specifically, the notch 52'' is much shallower than the notch 52 in FIG. 8 thereby forming an obstruction in the aligned notches. The combined spacer and key 42'' may be placed between any two adjacent carrier housings the same as that described for the spacers 42. The spacer and key 42'' mate with a notch formed in the edge of a member inserted into the aligned notches.

Figure 14:
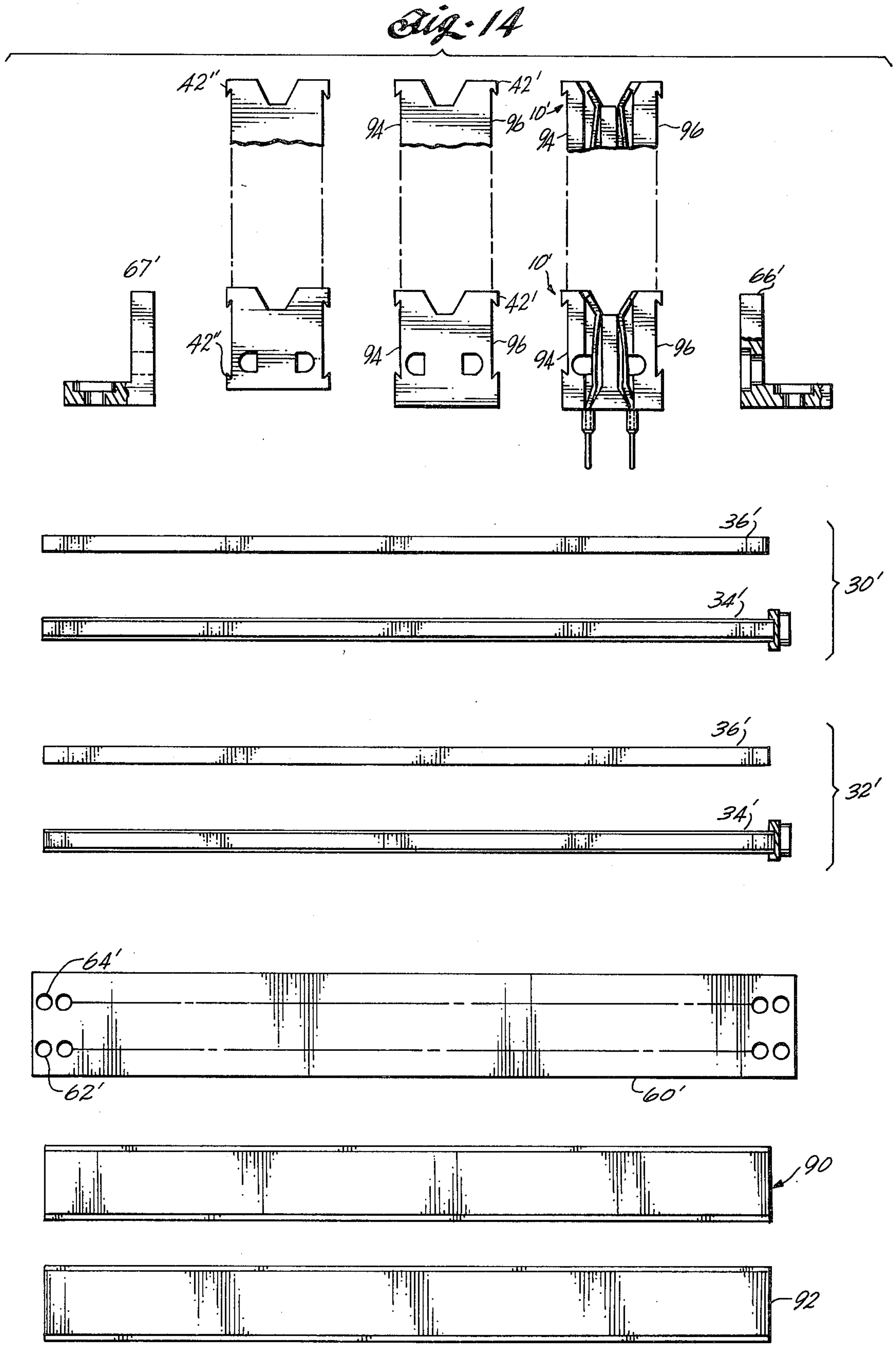
FIG. 14 is a schematic illustration similar to that depicted in FIG. 10 of an alternate kit for a connector assembly containing the various parts depicted in FIGS. 11-13.

FIG. 14 shows a kit for a connector assembly similar to that depicted in FIG. 10 except that the modified parts depicted in FIGS. 11 and 12 are substituted in place of the correspondingly numbered (but unprimed) parts depicted in FIG. 10. In addition a plurality of the combined spacers and keys are depicted at 42'' and stiffeners are depicted at 90 and 92.

The assembly of the various parts of the kit depicted in FIG. 14 is similar to that described with reference to FIG. 10 except that prior to affixing the end caps 66' and 67', the stiffeners 90 and 92 are slid into the channels 94 and 96.

Preferably the spring contacts 22, 24 are programmable in that they may be inserted or removed from the top or from the opening of the notch. Specifically, the contacts may be forcefit down through openings provided in the contact module for each spring contact. As a result, one contact may be placed on either side of the contact carrier housing or two contacts may be inserted as depicted in FIG. 4. The contacts are replaceable from the top without any connector disassembly. Additionally it will be noted that the contact carrier housings can be placed adjacent to each other without a spacer should it be so desired.

Although an exemplary embodiment of the invention has been disclosed for purposes of illustration, it will be understood that various changes, modifications and substitutions may be incorporated into such embodiment without departing from the spirit of the invention as defined by the claims appearing hereinafter.

What is claimed:

1. A low insertion force connector assembly comprising:

a plurality of contact modules, each comprising a nonconductive contact carrier housing having oppositely facing sides and comprising, extending between the oppositely facing sides, a pair of cam openings and a notch, each cam opening having a cam surface and at least one electrical spring contact cantilever mounted in the carrier housing and projecting from the mount adjacent one of the cam openings and along a side of the notch, the contact modules being aligned with the notches in a common row and with the cam openings in first and second aligned rows; and first and second cam actuating means extending through, respectively, the first and second rows of cam openings, each cam actuating means being adapted for applying a force between at least one of the cam surfaces of the corresponding row of cam openings and the cantilevered contacts which are adjacent such cam openings thereby actuating such cantilevered contacts into contact with a member inserted into the aligned notches.

2. A connector assembly according to claim 1 comprising a spacer between adjacent carrier housings, each spacer having oppositely facing sides and comprising, extending between the oppositely facing sides, a pair of cam openings and a notch, each opening of each pair of cam openings in each spacer being aligned with a different one of the rows of cam openings in the carrier housings and the notch in each spacer being aligned with the row of notches in the carrier housings, each cam actuating means extending through the cam openings of the respective row of cam openings of each such spacer.

3. A connector assembly according to claim 1 comprising at least one combined spacer and key positioned between at least two adjacent carrier housings, the combined spacer and key having oppositely facing sides and comprising, extending between the oppositely facing sides thereof, a pair of cam openings, each of said cam openings being aligned with a different one of the rows of openings in the carrier housings, the combined spacer and key forming an obstruction in the aligned row of notches, each cam actuating means extending through the cam openings, of the respective row of cam openings, of each such spacer and key.

4. A connector assembly according to claim 1 wherein the cam surface in each carrier housing forms a bearing for the cam actuating means, the bearing being positioned in the carrier housing so that the force on each carrier housing through the bearing, due to the cam actuating means and contacts when the contacts are actuated, is completely contained in the same carrier housing without spreading the carrier housing.

5. A connector assembly according to claim 1 wherein in each carrier housing the at least one contact extends, when deactuated, at least partially in front of the adjacent opening.

6. A connector assembly according to claim 1 wherein each of said cam actuating means comprises an elongated cam shaft and a nonconductive strip of insulating material separating the cam shaft from each of the contacts, the cam shaft and insulating material extending through the respective rows of cam openings.

7. A connector assembly according to claim 6 wherein each of the nonconductive strips is retained by the periphery of at least some of the openings through which the nonconductive strips extend and by the adjacent shaft.

8. A connector assembly according to claim 6 comprising manually operable means at an end of each cam shaft for rotating the corresponding cam shaft.

9. A connector assembly according to claim 6 wherein each of said cam shafts is "D" shaped in cross-section.

10. A connector assembly according to claim 1 wherein the notch of each carrier housing is defined by an open end opposite from a closed end and a pair of spaced sides extending between the open end and the closed end, the carrier housing having a further side opposite from the open end of the notch, the cam openings of each carrier housing being located between the closed end of the notch and the further side of the housing to thereby eliminate spreading of the carrier housing at a side of the notch.

11. A connector assembly according to claim 10 wherein the carrier housing consists of a unitary nonconductive member.

12. A connector assembly according to claim 1 wherein the carrier housing comprises a bottom side opposite from the notch, said at least one contact comprising at least one electrically conductive connecting pin which is in electrical communication with said at least one contact and exposed at the bottom side of said carrier housing.

13. A connector assembly according to claim 12 wherein each carrier housing comprises, extending from the bottom side thereof, at least one nonconductive support surrounding a portion of said at least one pin and extending from the bottom side of the carrier housing.

14. A connector assembly according to claim 13 comprising a base member extending along the bottom side of all of the carrier housings and comprising at least one opening therethrough for each carrier housing for receipt of the at least one support for each housing.

15. A connector assembly according to claim 14 comprising a separate end cap for supporting each end of the aligned carrier housings, and comprising means for affixing each such end cap to the base member, each of the cam actuating means being retained by each end cap and being exposed for actuation exterior to at least one of the end caps.

16. A connector assembly according to claim 1 wherein each carrier housing comprises at least one recess in one of the opposing sides thereof in which said at least one contact is contained for movement toward and away from the non-adjacent side of the notch.

17. A low insertion force connector assembly comprising:

a plurality of contact modules, each comprising a nonconductive contact carrier housing having oppositely facing sides and comprising, extending between the oppositely facing sides, at least one cam opening and a notch, the at least one cam opening having a cam surface, and at least one electrical spring contact cantilever mounted in the contact housing and projecting from the mount adjacent the at least one cam opening and along a side of the notch, the contact modules being aligned with the notches in a common row and with the at least one cam openings of the contact modules aligned in at least one row; and cam actuating means extending through the at least one row of cam openings, the cam actuating means being adapted for applying a force between at least one of the cam surfaces of the at least one row of cam openings and the adjacent cantilevered contacts thereby actuating such cantilevered contacts into contact with a member inserted into the aligned notches.

18. A low insertion force connector assembly comprising:

a plurality of contact modules, each comprising a nonconductive contact carrier housing having oppositely facing sides and comprising, extending between the oppositely facing sides, a pair of cam openings and a notch, each cam opening having a cam surface, and first and second means for cantilever mounting spring contacts, the first means for mounting being adapted for mounting a spring contact adjacent one of the cam openings and along one side of the notch, the other means for mounting being adapted for mounting a spring contact adjacent the other one of the cam openings and along a different side of the notch, the contact modules being aligned with the notches in a common row and with the cam openings in first and second aligned rows; and first and second cam actuating means extending through, respectively, the first and second rows of cam openings, each cam actuating means being adapted for applying a force between at least one of the cam surfaces of the corresponding row of cam openings and the cantilevered contacts which are adjacent such cam openings thereby actuating such cantilevered contacts into contact with a member inserted into the aligned notches.

19. A low insertion force connector assembly comprising:

a plurality of contact modules, each comprising a nonconductive contact carrier housing having oppositely facing sides and comprising, extending between the oppositely facing sides, a pair of cam openings and a notch, each cam opening having a cam surface, and a pair of spaced electrical spring contacts each cantilever mounted in the carrier housing and projecting from the mount adjacent a different one of the cam openings and along a different side of the notch, the contact modules being aligned with the notches in a common row and the cam openings in first and second aligned rows; and first and second cam actuating means extending through, respectively, the first and second rows of cam openings, each cam actuating means being adapted for applying a force between at least one of the cam surfaces of the corresponding row of cam openings and the cantilevered contacts which are adjacent such cam openings thereby actuating such cantilevered contacts into contact with a member inserted into the aligned notches.

20. A connector assembly according to claim 19 comprising a spacer between adjacent carrier housings, each spacer having oppositely facing sides and comprising, extending between the oppositely facing sides, a pair of cam openings and a notch, each opening of each pair of cam openings in each spacer being aligned with a different one of the rows of cam openings in the carrier housings and the notch in each spacer being aligned with the row of notches in the carrier housings, each cam actuating means extending through the cam openings, of the respective row of cam openings, of each such spacer and carrier housing.

21. A connector assembly according to claim 19 wherein each of said cam actuating means comprises an elongated cam shaft and a nonconductive strip of insulating material separating the cam shaft from each of the contacts, the cam shaft and insulating material extending through the respective row of cam openings.

22. A connector assembly according to claim 21 wherein each of the nonconductive strips is fixedly retained in a predetermined position relative to the at least one contact by the periphery of at least some of the cam openings through which the nonconductive strip extends and by the adjacent shaft.

23. A connector assembly according to claim 21 comprising manually operable means at an end of each shaft for rotating the corresponding shaft.

24. A connector assembly according to claim 21 wherein each of said cam shafts is "D" shaped.

25. A connector assembly according to claim 19 wherein each of the cam surfaces in each carrier housing forms a bearing for the corresponding cam actuating means, the bearing being positioned so that the force on each carrier housing, due to the cam actuating means and contacts through the bearing when the contacts are actuated, is completely contained in the same carrier housing without spreading the carrier housing.

26. A connector assembly according to claim 19 wherein the notch of each carrier housing is defined by an open end opposite from a closed end and a pair of spaced sides extending between the open end and the closed end, the carrier housing having a further side opposite from the open end of the notch, the pair of cam openings of each carrier housing being located between the closed end of the notch and the further side of the housing to thereby eliminate spreading of the carrier housing at each side of the notch.

27. A connector assembly according to claim 19 wherein in each carrier housing the pair of cam openings each have a portion thereof between which the corresponding pair of contacts are positioned.

28. A connector assembly according to claim 19 wherein each carrier housing comprises a bottom side opposite from the notch, each of the contacts of each housing comprising an electrically conductive connecting pin exposed at the bottom side of the respective carrier housing.

29. A connector assembly according to claim 28 wherein each carrier housing comprises, extending from the bottom side thereof, a pair of nonconductive supports each surrounding a portion of a different one of the pins and extending from the bottom side of the carrier housing.

30. A connector assembly according to claim 29 comprising a base member extending along the bottom side of all of the carrier housings and comprising a pair of openings therethrough for each carrier housing aligned so that a different one of the pair of supports extends through each opening in the base member.

31. A connector assembly according to claim 30 comprising a separate end cap for supporting each end of the aligned carrier housings, and comprising means for affixing each such end cap to the base member, each of the cam actuating means being retained by each end cap and being exposed for actuation exterior to at least one of the end caps.

32. A connector assembly according to claim 19 wherein each carrier housing comprises at least one recess in one of the opposing sides thereof in which each of the pair of cantilevered contacts is contained for movement toward and away from the other contact.

33. A contact carrier housing for up to two electrical spring contacts comprising:

a nonconductive member comprising substantially oppositely facing first and second outer sides and substantially oppositely facing third and fourth outer sides between the first and second sides, a notch in the member having an open end at the third side and a closed end between the third and fourth sides, a pair of spaced cam openings, each having a cam surface, the notch and a pair of cam openings extending through the member between the first and second sides, at least one recess in the first side of the member communicating with the notch for receiving such spring contacts, and first and second spaced spring contact mounting passages extending through the member from the at least one recess to the fourth side of said member each for receipt of such a spring contact.

34. A contact carrier housing according to claim 33 wherein the member comprises first and second tubular shaped mounting supports on the fourth side of the member in communication with, respectively, said first and second passages.

35. A low insertion force connector kit comprising:

a plurality of electrical spring contacts;

a plurality of nonconductive contact carrier housings each having oppositely facing sides and comprising, extending through the housing between the oppositely facing sides, a pair of cam openings and a notch, each cam opening having a cam surface, each carrier housing comprising first and second means for cantilever mounting separate ones of said electrical spring contacts, the first means for mounting being adapted for mounting a spring contact adjacent one of the cam openings and along one of the sides of the notch and the other means for mounting being adapted for mounting a different spring contact adjacent a different one of the cam openings and along a different side of the notch, the carrier housings being dimensioned so as to be alignable with the notches thereof in a common row and with said cam openings aligned in first and second rows; and first and second cam actuating means adapted for extending through, respectively, the first and second rows of cam openings when so aligned, each cam actuating means being adapted for applying a force between at least one of the cam surfaces of the corresponding row of cam openings and the cantilevered contacts which are adjacent such cam openings thereby actuating such cantilevered contacts into contact with a member inserted into the aligned notches.

36. A connector kit according to claim 35 wherein each cam surface in each carrier housing forms a bearing for the corresponding cam actuating means, the bearing being positioned in the carrier housing so that the force on each carrier housing through the bearing, due to the cam actuating means and contacts, when the contacts are actuated, is completely contained in the same carrier housing without spreading the carrier housing.

37. A connector kit according to claim 35 wherein each carrier housing comprises a notch defined by an open end opposite from a closed end and a pair of spaced sides extending between the open end and the closed end, the carrier housing having a further side opposite from the open end of the notch, the pair of cam openings of each carrier housing being located between the closed end of the notch and the further side of the housing to thereby eliminate spreading of the carrier housing at each side of the notch.

38. A connector kit according to claim 35 wherein in each carrier housing a mounted cantilevered contact extends, when deactuated, in front of the adjacent cam opening.

39. A connector kit according to claim 35 wherein each carrier housing has a further side through which the notch opens and a still further side opposite from the further side and wherein the kit further comprises a base member for extending along the still further side of all of the carrier housings when aligned for mounting each of the carrier housings in a common assembly.

40. A connector kit according to claim 35 comprising a plurality of spacers each for positioning between two adjacently positioned carrier housings, the spacers each having oppositely facing sides and, extending between the oppositely facing sides thereof, a pair of cam openings, each cam opening in each spacer being alignable with a different one of the first and second aligned rows of cam openings in the carrier housings.

41. A connector kit according to claim 40 wherein at least one of said spacers comprises a key which forms an obstruction in the common row of notches when such spacer is aligned.

42. A low insertion force connector kit comprising:

a plurality of contact modules, each comprising a nonconductive contact carrier housing having oppositely facing sides and comprising, extending through the housing between the oppositely facing sides, at least one cam opening and a notch, the at least one cam opening having a cam surface, and at least one electrical spring contact cantilever mounted in the contact housing and projecting adjacent the at least one cam opening and along a side of the notch, the contact modules being dimensioned so as to be alignable with the notches in a common row and with the at least one cam opening in an aligned row; and cam actuating means adapted for extending through the row of cam openings, the cam actuated means being adapted for applying a force between at least one of the cam surfaces and the cantilevered contact for actuating all of the cantilevered contacts into contact with a member inserted into the aligned notches.

43. A low insertion force connector kit comprising:

a plurality of contact modules, each comprising a nonconductive contact carrier housing having oppositely facing sides and comprising, extending between the oppositely facing sides, a pair of cam openings and a notch, each cam opening comprising a cam surface, and a pair of spaced electrical spring contacts each cantilever mounted in the carrier housing and projecting adjacent a different one of the cam openings and along a different side of the notch, the contact modules being dimensioned so as to be alignable with the notches in a common row and with the cam openings in first and second aligned rows; and first and second cam actuating means adapted for extending through, respectively, the first and second rows of openings, each cam actuating means being adapted for applying a force between at least one of the cam surfaces of the corresponding row of cam openings and the cantilevered contacts which are adjacent such cam openings thereby actuating such cantilevered contacts into contact with a member inserted into the aligned notches.

* * * * *